United States Patent
Rumsey et al.

[19]

[11] Patent Number: 6,094,153
[45] Date of Patent: Jul. 25, 2000

[54] ANALOG-TO-DIGITAL CONVERTER CIRCUIT

[75] Inventors: Bret T. Rumsey, Chandler; Jack W. Heller, Mesa, both of Ariz.

[73] Assignee: Intel Corporation, Santa Clara, Calif.

[21] Appl. No.: 09/031,313

[22] Filed: Feb. 25, 1998

[51] Int. Cl.[7] .............................. H03M 1/12; H03M 1/00
[52] U.S. Cl. .......................................... 341/155; 341/141
[58] Field of Search ..................................... 341/122, 141, 341/155; 348/15, 14, 462, 484

[56] References Cited

U.S. PATENT DOCUMENTS

| | | | |
|---|---|---|---|
| 4,353,057 | 10/1982 | Bernet et al. | 341/122 |
| 4,514,760 | 4/1985 | Balaban et al. | 348/484 |
| 4,677,422 | 6/1987 | Naito | 341/122 |
| 5,061,926 | 10/1991 | Washiyama | 341/122 |
| 5,150,211 | 9/1992 | Charbonnel et al. | 348/462 |
| 5,212,483 | 5/1993 | Wakimoto | 341/141 |
| 5,248,973 | 9/1993 | Babu et al. | 341/156 |
| 5,412,386 | 5/1995 | Sezi | 341/141 |
| 5,592,164 | 1/1997 | Hilbert et al. | 341/120 |
| 5,675,337 | 10/1997 | Moriyama | 341/141 |
| 5,703,584 | 12/1997 | Hill | 341/141 |
| 5,861,829 | 1/1999 | Sutardja | 341/122 |

*Primary Examiner*—Michael Tokar
*Assistant Examiner*—Patrick Wamsley
*Attorney, Agent, or Firm*—Howard A. Skaist

[57] ABSTRACT

Briefly, in accordance with one embodiment of the invention, a complementary metal-oxide semiconductor (CMOS) integrated circuit includes: a CMOS image sensor. The integrated circuit further includes an analog-to-digital (A/D) converter, at least one analog signal storage circuit, and control circuitry to multiplex the application of signals to the A/D converter from the image sensor and the at least one analog signal storage circuit.

17 Claims, 2 Drawing Sheets

ANALOG-TO-DIGITAL CONVERTER CIRCUIT

BACKGROUND

1. Field

The present invention relates to analog-to-digital (A/D) converters, and more particularly, to an A/D converter employed to interleave audio and video data signal streams.

2. Background Information

Recent advances in complementary metal-oxide semiconductor (CMOS) technology have made CMOS image sensors more attractive relative to charge-coupled device (CCD) sensors, for example. Likewise, with increasing integration of CMOS technology on a single chip, it is becoming desirable in a single system to include the capability to process and/or store both image data signals and audio data signals. In this context, the terms "audio data signals" and "image data signals" refer to electrical signals that represent audio data and image data respectively, as opposed to audio signals and image signals which refer to audible signals and optical signals. In such a system, for example, it may be desirable to take a "picture" and record associated audio information about the picture. For example, a description of the situation or the individuals might be desired, Unfortunately, incorporating additional functionality on a single integrated circuit may become expensive due to the silicon "real estate" that would usually be employed to provide the additional features and/or functionality. A need, therefore, exists to have the capability to provide additional features and/or functionality on a single integrated circuit in a cost effective manner.

SUMMARY

Briefly, in accordance with one embodiment of the invention, a complementary metal-oxide semiconductor (CMOS) integrated circuit includes: a CMOS image sensor. The integrated circuit further includes an analog-to-digital (A/D) converter, at least one analog signal storage circuit, and control circuitry to multiplex the application of signals to the A/D converter from the image sensor and the at least one analog signal storage circuit.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION

Figure 1:
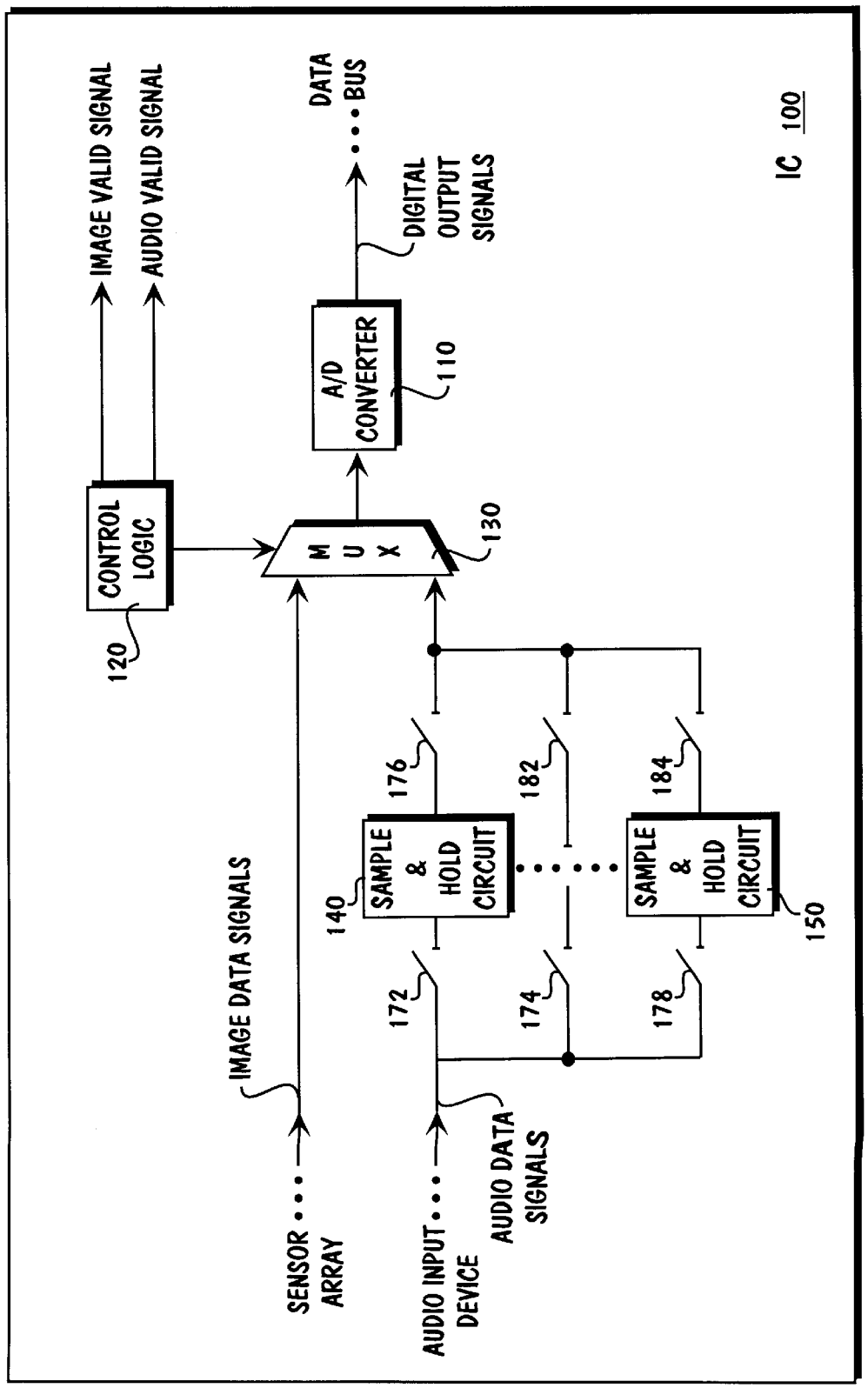
FIG. 1 is a block diagram illustrating an embodiment of an analog-to-digital converter in accordance with the invention.

In the following detailed description, specific details are set forth in order to provide a thorough understanding of the invention. However, it will be understood by those skilled in the relevant art that the present invention may be practiced without these specific details. In other instances, well-known methods, procedures, components and circuits have not been described in detail so as not to obscure the present invention.

As previously described, CMOS image sensors have become more desirable relative to alternative technologies, such as CCD sensors, due to recent advances in the technology and other improvements, such as in the cost effectiveness of such CMOS sensors, for example. One advantage that CMOS sensors offer relative to CCD sensors is the ability to integrate on a single integrated circuit additional circuitry to provide additional functionality, such as to provide features that may be desirable to consumers, for example. The additional features and functionality provided by this additional circuitry may make the resulting integrated circuit chip more desirable from an end user perspective, while also making it more cost effective to produce a single integrated system on an integrated circuit chip due to the difficulty, in comparison, of integrating such additional circuitry with CCD sensors on a single integrated circuit chip.

Despite the ability to integrate additional circuitry and, therefore, provide additional functionality on an integrated circuit chip, the expense of providing the silicon and employing additional silicon processing to produce the additional circuitry, nonetheless, provides additional production costs. It would be desirable if, for example, the capability existed to employ additional circuitry on the chip, in addition to the CMOS sensor, in order to complete multiple tasks. This approach might reduce the cost of production by reducing the amount of circuitry for the complete system to provide the desired functionality.

One example of a typically standard circuit component that is employed in a variety of circuit configurations is an analog-to-digital (A/D) converter. This occurs because, typically, analog signals from a variety of sources may be received and converted to digital signals, for ease of processing and other reasons. In this context, the terms "analog signal" and "digital signal" refer to the nature of the signal level rather than the time index of the signal. Therefore, a sampled voltage stored on a capacitor, for example, may comprise an analog signal in this context.

In a system that might process both image data signals and audio data signals, multiple A/D converters are typically employed so that this processing may be performed in parallel. If the A/D converters could be employed to perform this processing serially, rather then in parallel, than the overall cost of an integrated circuit chip would be reduced because the number of A/D converters employed and, therefore, to be fabricated would be reduced. One disadvantage, however, of processing these data signals serially, rather than in parallel, as previously described, is that the overall performance of the system may be reduced. Furthermore, for multimedia processing, it may not be desirable to process the audio and video signals serially, due to the desire to coordinate the image data signals with the audio data signals in some situations.

FIG. 1 is a block diagram illustrating an embodiment 100 of an A/D converter circuit configuration in accordance with the present invention for use on an integrated circuit (IC) chip, such as an IC including a CMOS image sensor array. This particular embodiment of the invention provides the advantage of integrating a CMOS image sensor array on an IC with additional circuitry to provide additional functionality and features, while also configuring the system so that the number of A/D converters is reduced, without reducing the overall performance of the system. Thus, FIG. 1 illustrates an A/D converter circuit embodied on a single integrated circuit chip, although the invention is not restricted in scope in this respect.

This particular embodiment includes control circuitry, such as, control logic 120 and multiplexer (MUX) 130. Also provided in this particular embodiment are switches, such as, for example, 172, 174, 176, 178, 182, and 184, to which control signals may be applied to thereby control the application of audio data signals to particular storage circuits or units, such as 140 and 150, and also control the application of the stored signals from the storage units or circuits to MUX 130 and, ultimately, to A/D converter 110. Therefore, as illustrated in FIG. 1, either image data signals or audio data signals may be applied to MUX 130, depending on the signal provided by control logic 120 to MUX 130. The image or audio data signals applied to MUX 130 are, therefore, applied to an A/D converter 110 and the output digital signals of the A/D converter are provided to a data bus for storage and/or additional processing, depending upon the particular system. Likewise, control logic 120, in addition to controlling whether image data signals or audio data signals are applied to A/D converter 110, also provides a signal indicating the type of data signals being made available on the data bus (e.g., image or audio), as explained in more detail hereinafter.

Storage circuits or units, such as sample and hold circuits, for example, for, in this particular embodiment, storing audio data signals, are provided to ensure that the overall performance of the system is not degraded by the reduction in the number A/D converters. Thus, these circuits may be employed to store the audio data signals if the A/D converter is busy processing image data signals, for example. More specifically, there are periods of time between the processing of image data signals in which the A/D converter may, alternatively, be employed to convert analog signals to digital signals for audio data signals being received. This may be true even in periods in which the amount of image data signals to be processed is relatively large and, therefore, the use of the A/D converter to process image date signals is relatively intense. If, for example, a signal stream of analog signals representing audio data signals is received during a period in which a read out of a row of the CMOS sensor array occurs and, therefore, the A/D converter is being employed to convert or process image data signals, this signal stream may be stored, typically after being sampled, so that the analog signals may later be converted by the A/D converter to digital signals, that is, once conversion of the image data signals for the row being read out is complete in this particular embodiment. Of course, the invention is not limited in scope to situations in which only rows of CMOS image arrays are being read out. Of course, in alternative embodiments, the number of storage units or circuits provided may be varied, depending, for example, upon the desired rate of sampling the stream of analog signals representing, in this embodiment, audio data signals.

Figure 2:
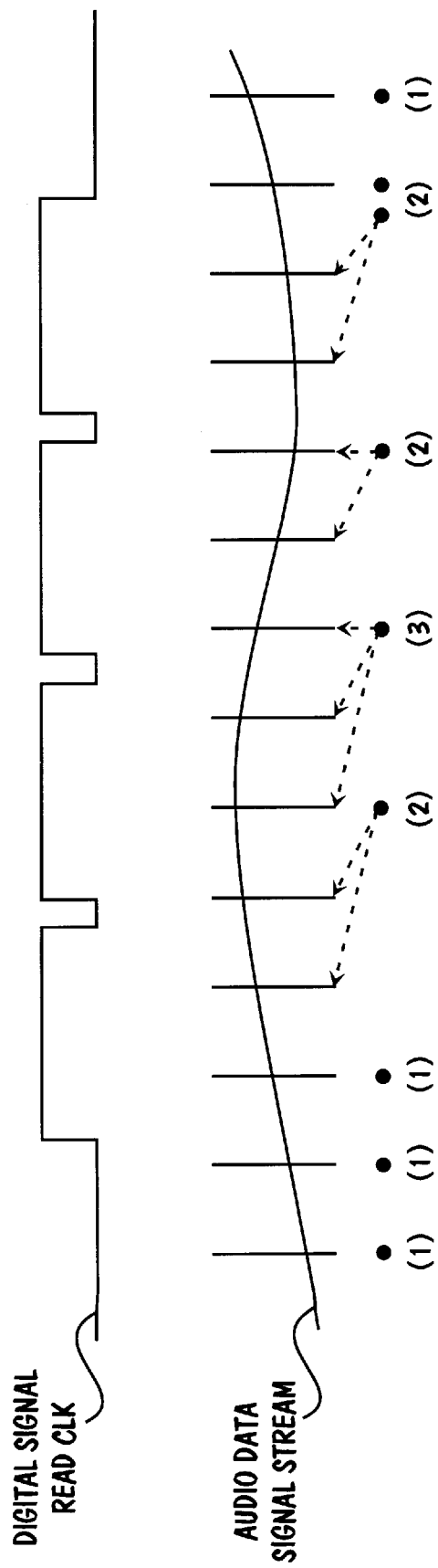
FIG. 2 is a plot of a image sensor line read out and an audio data signal stream to illustrate, at least in part, the operation of the embodiment of FIG. 1.

This relationship is illustrated by the plot of FIG. 2. The stream of digital signals in FIG. 2 illustrates multiple read outs of rows of image data signals in this embodiment, although, again, the invention is not limited in scope in this respect. Therefore, when the digital signals indicated are "high," the A/D converter is being employed to convert analog signals representing image data signals. However, when the digital signals indicated are low, the A/D converter is not being employed to process such analog signals. A reason the A/D converter is not being employed between row read outs in this particular embodiment is due at least in part to the production of analog image data signals by the pixel array or image sensor array, which introduces delays longer than the time to convert analog signals to digital signals. Therefore, depending on the situation, the A/D converter may be idle because the image sensor array may be sampling image data for the next row, such as, if video data signals are being processed, or, alternatively, may itself be idle, such as, if "snapshots" are being processed. Regardless of the precise reason, the A/D converter may experience some "dead" processing time. During this period, the A/D converter may be employed to convert analog signals representing audio data signals that, as previously described, have been stored in storage circuits, such as sample and hold circuits 140 and 150 in this particular embodiment, for example, to digital signals. In the plot of FIG. 2, the vertical lines illustrate samples of the analog signal stream to be processed that represents audio data signals. However, because the A/D converter may be "busy" during several of these sample times, these audio data signal stream samples are stored, as previously described. The heavy dots indicate the time at which these signal samples are actually converted by the A/D converter. Therefore, as illustrated, there may be situations in which two or three signal samples representing audio data signals are converted by the A/D converter because the signal samples were received while the A/D converter was processing signals representing image data signals.

Another advantage of this particular embodiment of an A/D converter circuit in accordance with the invention is the ability to perform the processing of the signal samples representing audio data signals without also providing timing for these signals. One reason timing signals may be omitted, in this particular embodiment, is because, as previously suggested, signals may be provided to the data bus, in this embodiment, indicating that digital signals representing either audio data signals or image data signals being made available. Alternatively, the analog stream may be sampled at predetermined regular intervals and, likewise, processed at predetermined regular intervals. Of course, where this approach is employed, chips or other devices receiving such signals would likely be limited to conform with such timing protocols.

Ultimately, in this particular embodiment of the invention, the sampling frequency for the analog stream representing the audio data signals is limited by the number of storage units or circuits for storing audio data signal samples. The following equation may be employed to determine the maximum sampling rate for a specified number of CMOS image sensor array columns or rows and signal storage units, although the invention is not limited in scope to being use in accordance with this equation:

$$F_{sample} = 1/[(X/N) * T_{clk}] \qquad [1]$$

where $F_{sample}$=the maximum sampling frequency of the signal stream;

$T_{clk}$=the period of the clock signal driving the sensors of the array;

X=the number of rows or columns to be read out; and

N=the number of storage units or circuits.

The invention is not limited in scope to any particular type of A/D converter or A/D converter architecture. For example, although the invention is not limited in scope in this respect, a flash A/D converter, such as an A/D converter that performs conversions using a large array of parallel comparators resulting in digital data signals for a single clock, or a pipelined A/D converter may be employed. Likewise, the signal stream representing audio data signals may originate from a variety of audio signal input devices, although typically the analog signal may originate from a microphone that converts an analog audio signal to an analog electrical signal that represents the audio signal. Furthermore, in some embodiments, it may be desirable to micro-machine a microphone on chip for this purpose, although the invention is not limited in scope in this respect.

An embodiment of a method of interleaving an signal stream comprising audio data signals and a signal stream comprising image data signals, such as, for example, video data signals, in accordance with the present invention includes the following. Analog signals may be produced that represent or originate from image data signals. For example, as previously described, a CMOS image sensor may produce such analog signals from image data signals. These analog signals may be applied to an analog-to-digital or A/D converter which converts the analog image data signals to digital image data signals for additional or further processing and/or storage. For example, as previously described, although the invention is not limited in scope in this respect, such an analog-to-digital conversion may be performed by any one of a number of types of analog-to-digital converters. An analog audio data signal stream may be received while the analog image data signals are being converted by the A/D converter. If this occurs, the analog audio signal stream may be applied to one of a plurality of storage units or circuits, such as, for example, a plurality of sample and hold circuits for storing analog audio data signals. Once the A/D converter has completed converting the particular sequence of analog image data signals, typically a row or column of the CMOS image sensor, although, of course the invention is not limited in scope in this respect, then the signals representing the audio data signals that have been stored are applied to the A/D converter for conversion from discrete analog signals to digital signals for additional processing and/or storage. One of ordinary skill in the art will, of course, appreciate that in this context the terminology analog and digital refer to the signal levels of the particular signals as opposed to the time reference or time index for the signals. Therefore, although the analog signal stream may be sampled and stored, such as by a sample and hold circuit, for example, the signal level stored is still analog and will be converted to digital signal levels by the A/D converter. Typically, the application of the analog image data signals and analog audio data signals is controlled by a MUX that multiplexes the signal streams comprising signal samples so that they are applied to the converter in different periods of converter operation. If the analog audio data signal stream is received when the converter is not being employed to convert analog image data signals, then the analog audio data signal stream is immediately applied to the converter for conversion from analog audio data signals to digital audio data signals. Therefore, the analog audio data signals are converted by the analog-to-digital converter between gaps in the conversion of the analog image data signals so that the overall performance of the system is not degraded by multiplexing the analog image and audio data signals, rather than processing the two types of analog data signals in parallel using separate A/D converters. In addition, where this method is implemented on a single integrated circuit chip, the amount of silicon employed is reduced, therefore reducing the overall cost of the system.

While certain features of the invention have been illustrated as described herein, many modifications, substitutions, changes, and equivalents will now occur to those skilled in the art. For example, an embodiment in accordance with the invention may be implemented without an audio data signal. It is, therefore, to be understood that the appended claims are intended to cover all such embodiments and changes as fall within the true spirit of the invention.

What is claimed is:

1. A complementary metal-oxide semiconductor (CMOS) integrated circuit comprising:
   a CMOS sensor image array; an analog-to-digital (A/D) converter; at least one analog signal storage circuit; and control circuitry to multiplex the application of signals to the A/D converter from the image sensor and the at least one analog signal storage circuit.

2. The CMOS integrated circuit of claim 1, wherein the at least one analog signal storage circuit comprises other additional substantially similar storage circuits in addition to the at least one analog signal storage circuit.

3. The CMOS integrated circuit of claim 1, wherein the at least one storage circuit stores at least one analog audio data signal.

4. The CMOS integrated circuit of claim 3, wherein said control circuitry includes the capability to signal whether the output signals of the A/D converter comprise digital image data signals or digital audio data signals.

5. The CMOS integrated circuit of claim 4, wherein the at least one storage circuit is coupled so as to receive an analog signal that originates from an audio signal input device.

6. The CMOS integrated circuit of claim 5, wherein said audio signal input device comprises a microphone.

7. The CMOS integrated circuit of claim 1, wherein the at least one storage circuit comprises a sample and hold circuit.

8. The CMOS integrated circuit of claim 7, and further comprising a data bus coupled so as to receive the digital output signals produced by said A/D converter.

9. A method of interleaving on a single integrated circuit (IC) chip a signal stream comprising audio data signals and a signal stream comprising image data signals, said methods comprising:
   converting on said IC a signal stream comprising analog image data signals to a signal stream comprising digital image data signals;
   storing on said IC signal samples of a signal stream comprising analog audio data signals while the signal stream comprising image data signals is being converted; and
   converting on said IC the stored signal samples to a signal stream comprising digital audio data signals after having converted the analog image data signals to digital image data signals.

10. The method of claim 9, wherein storing signal samples of the signal stream on said IC comprises sampling the signal stream to produce a signal sample on said IC and then storing the signal sample on said IC.

11. The method of claim 10, wherein the conversion from analog image data signals to digital image data signals and the conversion from analog audio data signals to digital data signals is performed by one A/D converter at different times.

12. The method of claim 11, wherein a signal applied to a MUX controls when the one A/D converter performs the conversion for the analog audio data signals and the analog image data signals.

13. The method of claim 9, and further comprising:
   applying the converted digital image data signals and converted audio data signals to a data bus.

14. The method of claim 13, wherein at least a portion of the data bus is on said IC.

15. The method of claim 14, and further comprising:
   producing a signal indicating when the digital audio data signals are being produced by the A/D converter.

16. The method of claim 14, and further comprising:
   producing a signal indicating when the digital image data signals are being produced by the A/D converter.

17. The method of claim 9, and further comprising, prior to storing the signal samples:
   producing the analog audio data signals from an audio signal.

* * * * *